(12) United States Patent
Kaneko

(10) Patent No.: US 12,581,940 B2
(45) Date of Patent: Mar. 17, 2026

(54) SEMICONDUCTOR DEVICE HAVING CONTACT PLUG

(71) Applicant: MICRON TECHNOLOGY, INC., Boise, ID (US)

(72) Inventor: Akira Kaneko, Higashihiroshima (JP)

(73) Assignee: Micron Technology, Inc., Boise, ID (US)

( * ) Notice: Subject to any disclaimer, the term of this patent is extended or adjusted under 35 U.S.C. 154(b) by 642 days.

(21) Appl. No.: 18/051,670

(22) Filed: Nov. 1, 2022

(65) Prior Publication Data

US 2024/0145384 A1 May 2, 2024

(51) Int. Cl.
| | |
|---|---|
| *H01L 23/528* | (2006.01) |
| *H01L 21/02* | (2006.01) |
| *H01L 21/3213* | (2006.01) |
| *H01L 21/48* | (2006.01) |
| *H01L 23/522* | (2006.01) |
| *H01L 23/532* | (2006.01) |

(52) U.S. Cl.
CPC .... *H01L 23/5283* (2013.01); *H01L 21/02271* (2013.01); *H01L 21/3213* (2013.01); *H01L 21/486* (2013.01); *H01L 23/5226* (2013.01); *H01L 23/53209* (2013.01); *H01L 23/5329* (2013.01)

(58) Field of Classification Search
CPC .......................... H01L 23/5283; H01L 23/5226
USPC ....................................................... 257/734
See application file for complete search history.

(56) References Cited

U.S. PATENT DOCUMENTS

| | | |
|---|---|---|
| 2014/0027822 A1 | 1/2014 | Su et al. |
| 2015/0262896 A1 | 9/2015 | Yamanaka et al. |
| 2020/0043785 A1* | 2/2020 | Chen ..................... H01L 23/535 |
| 2024/0162154 A1 | 5/2024 | Tsuchiya et al. |
| 2024/0222268 A1 | 7/2024 | Tashiro et al. |

OTHER PUBLICATIONS

U.S. Appl. No. 18/483,748 titled "Semiconductor Device Having Contact Plug", filed Oct. 10, 2023.
"U.S. Appl. No. 18/054,637, titled "Semiconductor Device Having Contact Plug", filed Nov. 11, 2022."

* cited by examiner

*Primary Examiner* — Quoc D Hoang
(74) *Attorney, Agent, or Firm* — Dorsey & Whitney LLP

(57) ABSTRACT

An apparatus that includes a first conductive pattern positioned at a first wiring layer and extending in a first direction, a second conductive pattern positioned at a second wiring layer located above the first wiring layer and extending in a second direction, and a contact plug connecting the first conductive pattern with the second conductive pattern. The contact plug includes a lower conductive section contacting the first conductive pattern and an upper conductive section contacting the second conductive pattern. The width of the lower conductive section on a first boundary between the lower and upper conductive sections in the first direction is greater than the width of the upper conductive section on the first boundary in the first direction and the width of the second conductive pattern on a second boundary between the contact plug and the second conductive pattern in the first direction.

15 Claims, 10 Drawing Sheets

SEMICONDUCTOR DEVICE HAVING CONTACT PLUG

BACKGROUND

A general semiconductor device includes a plurality of wiring layers. Wiring patterns respectively formed in two wiring layers vertically adjacent to each other may cross and be connected to each other via a contact plug provided at a crossing. When the diameter of the contact plug is small, the contact resistance becomes high. When the diameter of the contact plug is large, the dielectric strength between a wiring pattern adjacent to the wiring pattern connected to the contact plug and the contact plug is reduced.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1A:
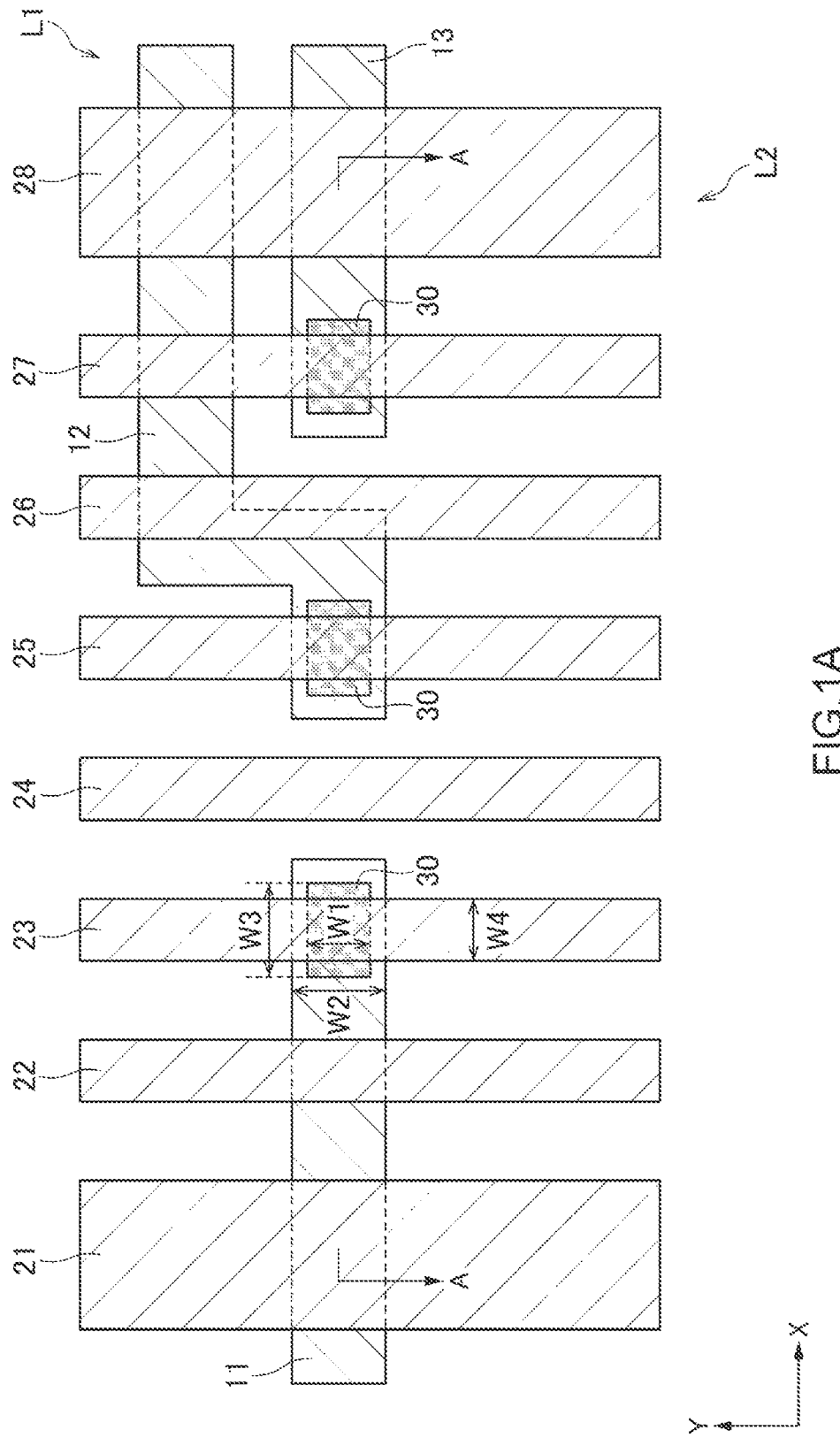
FIG. 1A is a schematic plan view showing a configuration of a main portion of a semiconductor device according to an embodiment of the present disclosure.
Figure 1B:
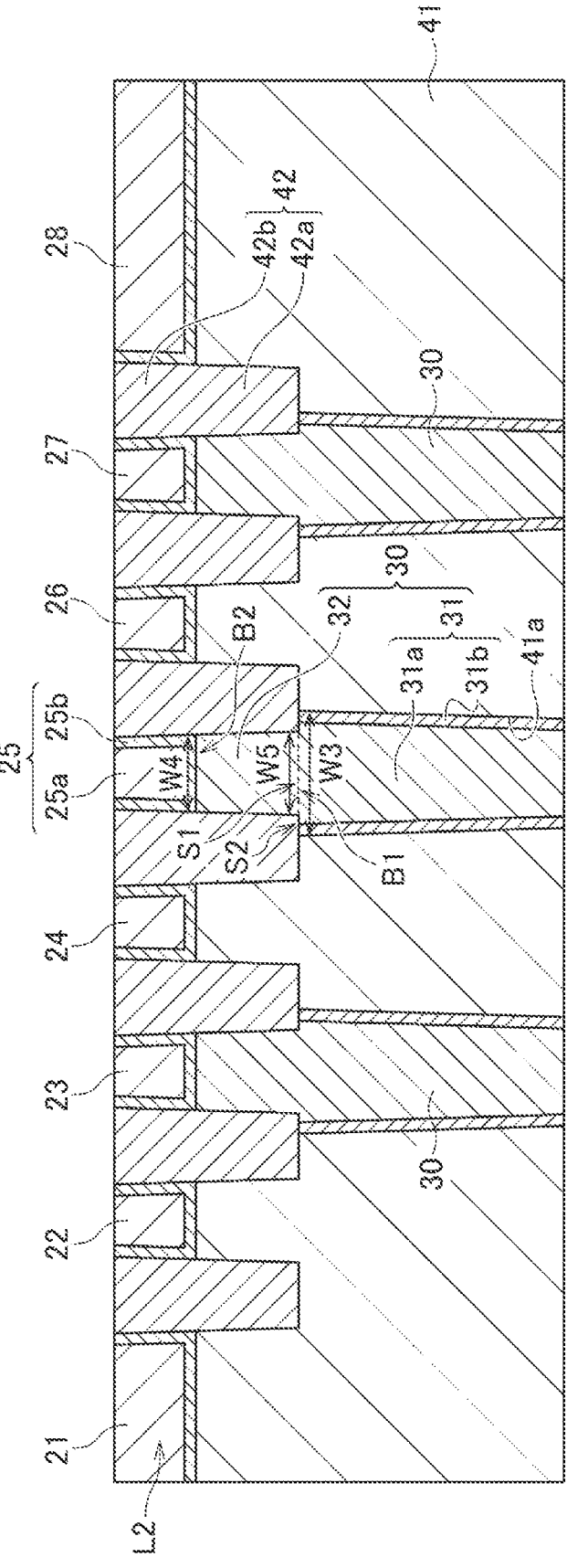
FIG. 1B is a schematic cross-sectional view taken along a line A-A in FIG. 1A.

FIG. 1A is a schematic plan view showing a configuration of a main portion of a semiconductor device according to an embodiment of the present disclosure. FIG. 1B is a schematic cross-sectional view taken along a line A-A in FIG. 1A. As shown in FIG. 1A, the semiconductor device according to the present embodiment includes wiring patterns 11 to 13 positioned at a conductor layer L1 and wiring patterns 21 to 28 positioned at a conductor layer L2. The conductor layer L1 is located below the conductor layer L2 and tungsten (W), for example, may be used as its material. The conductor layer L2 may be made of copper (Cu), for example. The wiring patterns 11 to 13 positioned at the conductor layer L1 extend mainly in the X direction, and the wiring patterns 21 to 28 positioned at the conductor layer L2 extend mainly in the Y direction. In some examples, the X direction and the Y direction may be perpendicular to each other. The wiring patterns 11 to 13 and the wiring patterns 23, 25, and 27 cross each other in plan view. Contact plugs 30 are provided in a crossing between the wiring pattern 11 and the wiring pattern 23, a crossing between the wiring pattern 12 and the wiring pattern 25, and a crossing between the wiring pattern 13 and the wiring pattern 27. With this configuration, the wiring pattern 11 and the wiring pattern 23, the wiring pattern 12 and the wiring pattern 25, and the wiring pattern 13 and the wiring pattern 27 are short-circuited to each other via the contact plugs 30, respectively. A width W1 in the Y direction of the contact plug 30 at its bottom surface in contact with each of the wiring patterns 11 to 13 may be smaller than a width W2 in the Y direction of the wiring pattern 11. Meanwhile, a maximum width W3 in the X direction of the contact plug 30 is larger than a width W4 in the X direction of the wiring pattern 23, 25, or 27 at its bottom surface in contact with the contact plug 30. The width in the X direction of the contact plug 30 at its top surface in contact with the wiring pattern 23, 25, or 27 may be also W4. The width in the X direction of the contact plug 30 at its top and that of the wiring pattern 23, 25, or 27 may substantially be the same, e.g. W4. By setting the width W3 to be larger than the width W4 in this manner, the resistance value of the contact plug 30 is reduced.

As shown in FIG. 1B, the wiring pattern 25 includes a main body 25a made of a metal, for example, copper (Cu) and a barrier metal portion 25b provided on the surface of the main body 25a. This is the same in the other wiring patterns 21 to 24 and 26 to 28. The contact plug 30 includes a lower conductive section 31 in contact with the wiring pattern 11 and an upper conductive section 32 in contact with the wiring pattern 23, 25, or 27. The lower conductive section 31 of the contact plug 30 includes a main body 31a made of a metal, for example, tungsten (W) and a barrier metal portion 31b provided on the surface of the main body 31a. Similarly, the upper conductive section 32 of the contact plug 30 includes a main body made of a metal, for example, tungsten (W) and a bather metal portion provided on the surface of the main body, but the bather metal portion of the upper conductive section 32 does not appear in the cross-section shown in FIG. 1B. The contact plug 30 is embedded in an interlayer insulating film 41 covering the conductor layer L1. The contact plug 30 is embedded in a via hole 41a formed in the interlayer insulating film 41. The diameter of the via hole 41a becomes smaller as its depth position becomes deeper. The thickness of the interlayer insulating film 41 is thick, and therefore the aspect ratio of the contact plug 30 is extremely large. A spacer insulating film 42 extending in the Y direction is provided on the interlayer insulating film 41. The spacer insulating film 42 includes a lower insulating section 42a embedded in the interlayer insulating film 41 and an upper insulating section 42b protruding from the interlayer insulating film 41. The wiring patterns 21 to 28 are each arranged between the upper insulating sections 42b of the spacer insulating films 42 adjacent to each other in the X direction. Accordingly, the side surfaces of the wiring patterns 21 to 28 are in contact with the upper insulating sections 42b of the spacer insulating films 42, and the bottom surface of each of the wiring patterns 21 to 28 is in contact with the interlayer insulating film 41 and the corresponding contact plug 30. The upper conductive section 32 of the contact plug 30 is sandwiched between the upper insulating sections 42b of the spacer insulating films 42 in the X direction and between the interlayer insulating films 41 in the Y direction. Meanwhile, the side surface of the lower conductive section 31 of the contact plug 30 is entirely surrounded by the interlayer insulating film 41.

Figure 1C:
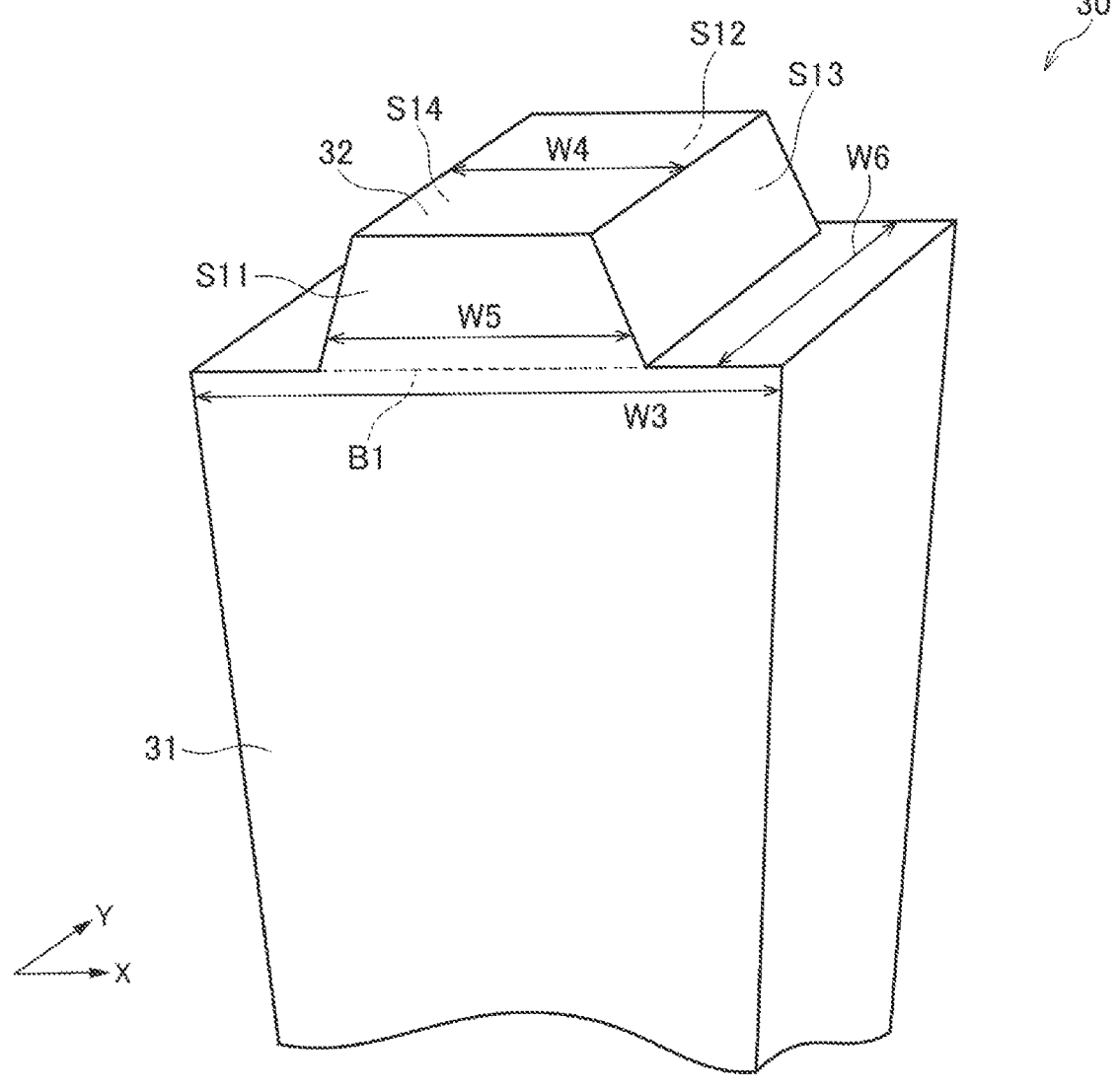
FIG. 1C is a schematic perspective view of a contact plug.

FIG. 1C is a schematic perspective view of the contact plug 30. As shown in FIG. 1C, the diameter in the X direction of the contact plug 30 rapidly changes at a boundary B1 between the lower conductive section 31 and the upper conductive section 32. The size in the X direction of the lower conductive section 31 is the maximum width W3 at the boundary B1. The size in the X direction of the upper conductive section 32 at the boundary B1 is a width W5 and is smaller than the width W3. The sizes in the Y direction of the lower conductive section 31 and the upper conductive section 32 at the boundary B1 are both W6. The sizes in the Y direction of the lower conductive section 31 and the upper conductive section 32 at the boundary B1 may be substantially the same, e.g. W6. The upper conductive section 32 of the contact plug 30 has side surfaces S11 and S12 that cross the Y direction and are located on opposite sides to each other and side surfaces S13 and S14 that cross the X direction and are located on opposite sides to each other. The surfaces of the side surfaces S11 and S12 are formed by the main body 31a and are in contact with the spacer insulating films 42. The surfaces of the side surfaces S13 and S14 are formed by the bather metal portion 31b and are in contact with the interlayer insulating film 41.

As shown in FIG. 1B, the top surface of the lower conductive section 31 which is located at the boundary B1 includes a region S1 in contact with the upper conductive section 32 and regions S2 that are located on both sides of the region S1 in the X direction and are in contact with the bottom surface of the spacer insulating films 42. The regions S2 are formed by the main body 31a and the bather metal portion 31b. At a boundary B2 between the contact plug 30 and the wiring pattern 23, 25, or 27, the sizes in the X direction of the contact plugs 30 and that of the wiring pattern 23, 25, or 27 are W4 and are smaller than the width W3. The sizes in the X direction of the contact plugs 30 and that of the wiring pattern 23, 25, or 27 may substantially be the same, e.g. W4.

With this configuration, the distance in the X direction between the upper conductive section 32 of the contact plug 30 connected to the wiring pattern 23 and the bottom surface of the wiring pattern 22 or 24 is increased. As a result, the dielectric strength between the contact plug 30 connected to the wiring pattern 23 and the wiring pattern 22 or 24 is increased. Similarly, the distance in the X direction between the upper conductive section 32 of the contact plug 30 connected to the wiring pattern 25 and the bottom surface of the wiring pattern 24 or 26 is increased, and the distance in the X direction between the upper conductive section 32 of the contact plug 30 connected to the wiring pattern 27 and the bottom surface of the wiring pattern 26 or 28 is increased. As a result, the dielectric strength between the contact plug 30 connected to the wiring pattern 25 and the wiring pattern 24 or 26 is increased, and the dielectric strength between the contact plug 30 connected to the wiring pattern 27 and the wiring pattern 26 or 28 is increased.

Figure 2A:
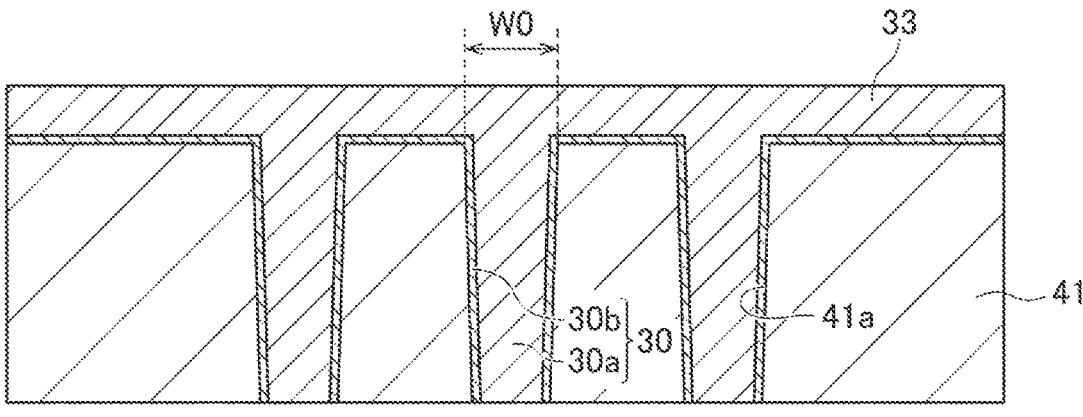
FIGS. 2A to 2H are process diagrams for explaining a manufacturing method of the semiconductor device according to the embodiment of the present disclosure.
Figure 2B:
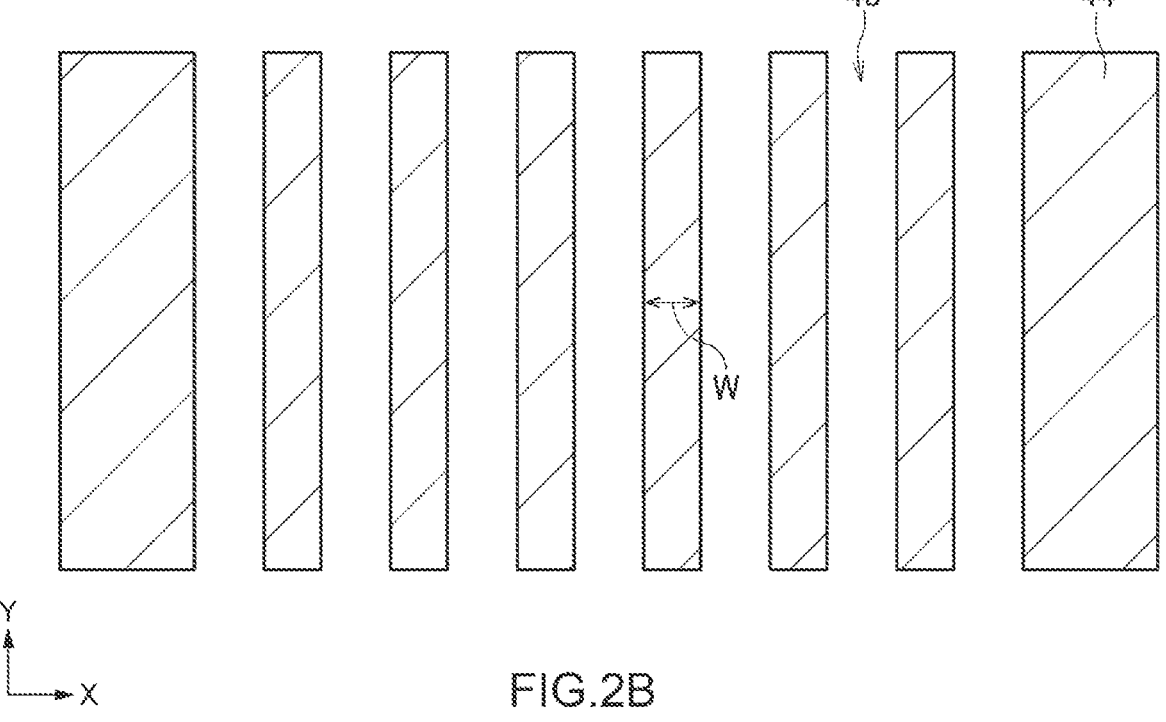
Figure 2C:
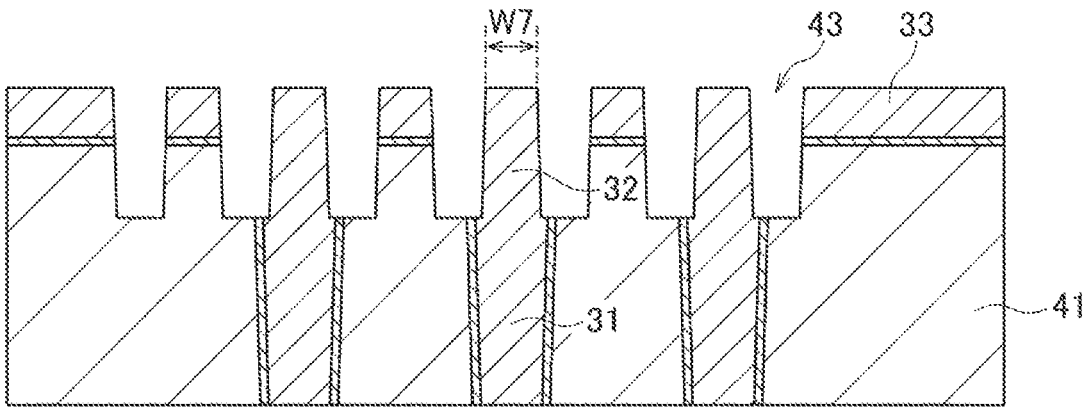

Next, a manufacturing method of the semiconductor device according to the present embodiment is described. First, as shown in FIG. 2A, the via hole 41a is formed in the interlayer insulating film 41, and thereafter the contact plug 30 including the bather metal portion 30b and the main body 30a is formed in the via hole 41a. The contact plug 30 penetrates through the interlayer insulating film 41 and is in contact with the wiring pattern 11. In addition, a sacrifice film 33 made of the same conductive material as the contact plug 30 is formed on the surface of the interlayer insulating film 41. Next, as shown in FIG. 2B, the entire surface is covered with mask 44, and thereafter the mask 44 is patterned in stripes by light exposure. As shown in FIG. 2C, the contact plug 30 and the interlayer insulating film 40 are then etched in this state, whereby a plurality of grooves 43 extending in the Y direction are formed in portions not covered with the mask 44. A space W7 between two of the grooves 43 adjacent to each other in the X direction is smaller than a size W0 (see FIG. 2A) in the X direction of the top surface of the contact plug 30. Accordingly, a part of the side wall of the contact plug 30 is removed by the grooves 43, so that a region sandwiched between the grooves 43 forms the upper conductive section 32 and a region located at a deeper position than the grooves 43 forms the lower conductive section 31.

Figure 2D:
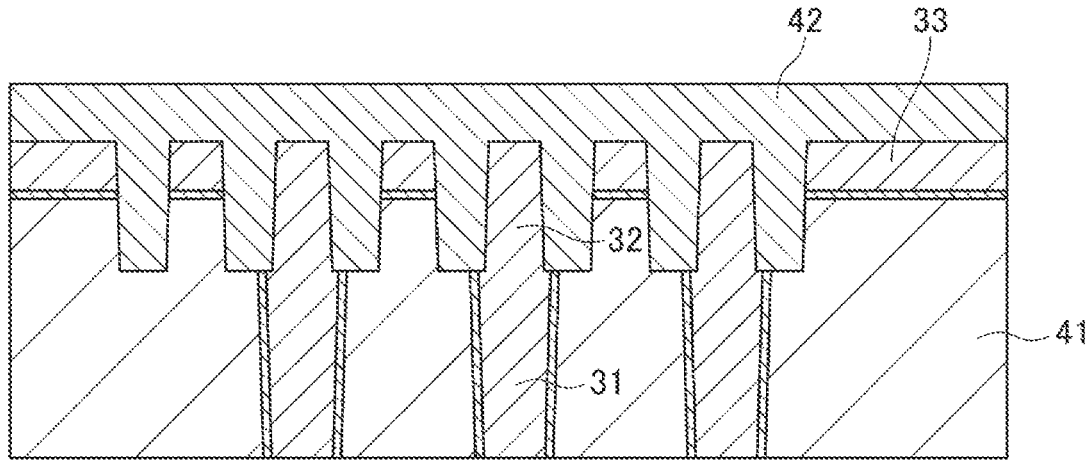
Figure 2E:
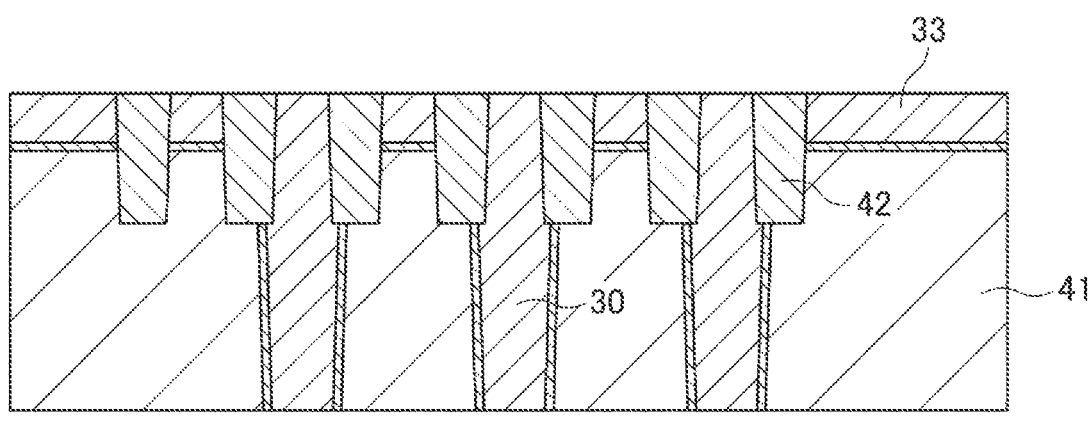
Figure 2F:
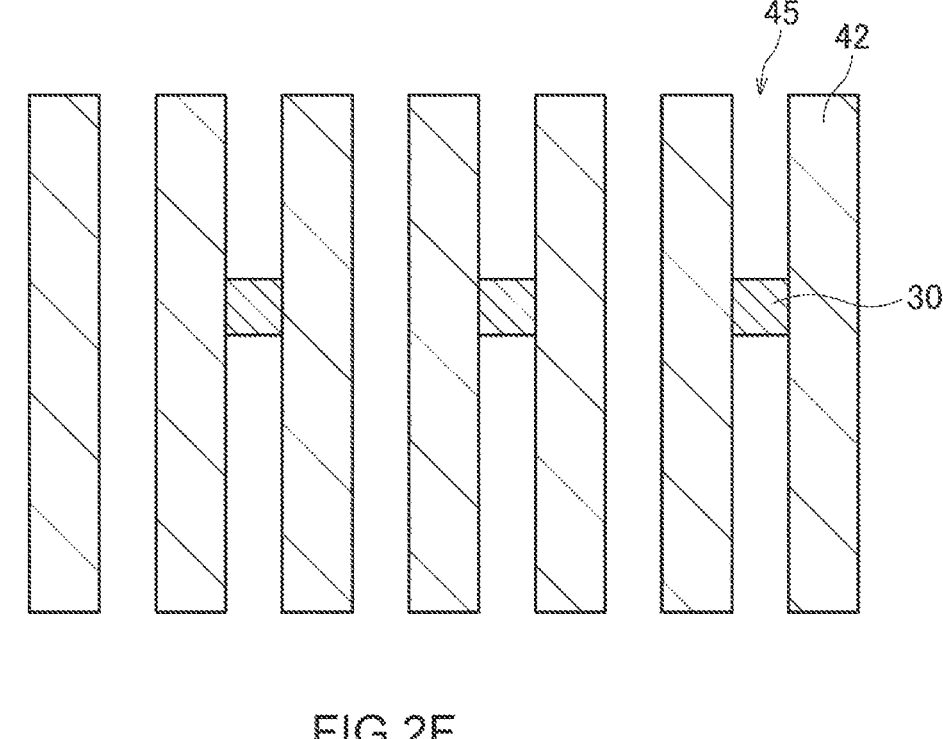
Figure 2G:
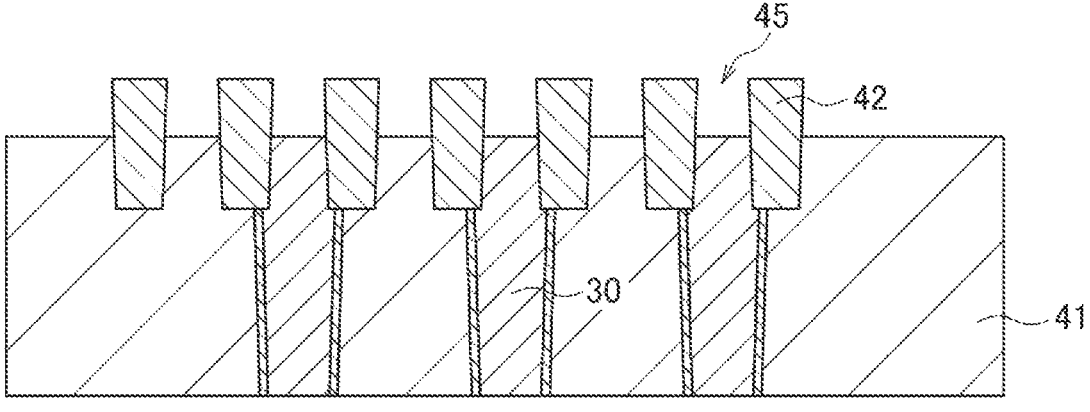
Figure 2H:
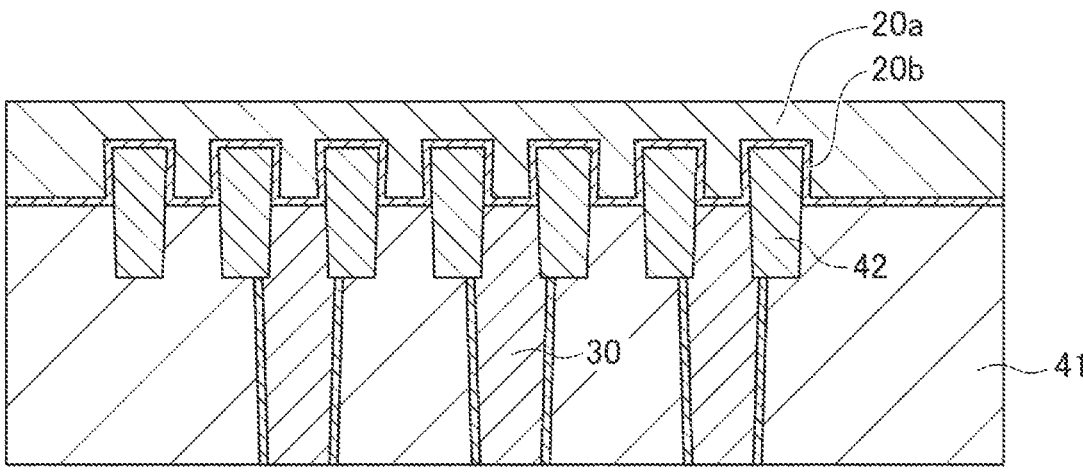

Next, as shown in FIG. 2D, the spacer insulating film 42 made of, for example, a Low-k material is deposited by CVD on the entire surface so as to fill the grooves 43. Thereafter, as shown in FIG. 2E, the spacer insulating film 42 is etched back or CMP is performed, whereby the sacrifice film 33 is exposed. Next, the sacrifice film 33 and the interlayer insulating film 41 are etched back with the spacer insulating film 42 used as mask, whereby a plurality of grooves 45 extending in the Y direction are formed as shown in FIG. 2F and FIG. 2G which is a cross-sectional view corresponding to FIG. 2F. The upper conductive section 32 of the contact plug 30 is exposed at the bottom surface of each groove 45. Next, as shown in FIG. 2H, a conductive material 20a made of, for example, Cu is formed on the entire surface via a barrier metal 20b so as to fill the grooves 45, and CMP is then performed until the spacer insulating film 42 is exposed, thereby obtaining the configuration shown in FIG. 1B.

In the present embodiment, the grooves 43 between which the space W7 in the X direction is smaller than the width W0 of the top surface of the contact plug 30 are formed, and the spacer insulating film 42 is embedded in the grooves 43, as described above. Therefore, the size in the X direction of the upper conductive section 32 of the contact plug 30 can be reduced. Further, after the grooves 43 are filled with the spacer insulating film 42, the other grooves 45 are formed between the spacer insulating films 42 adjacent to each other in the X direction, and each of the wiring patterns 21 to 28 is embedded in the corresponding groove 45. Therefore, dedicated mask for forming the wiring patterns 21 to 28 is also unnecessary.

Figure 3A:
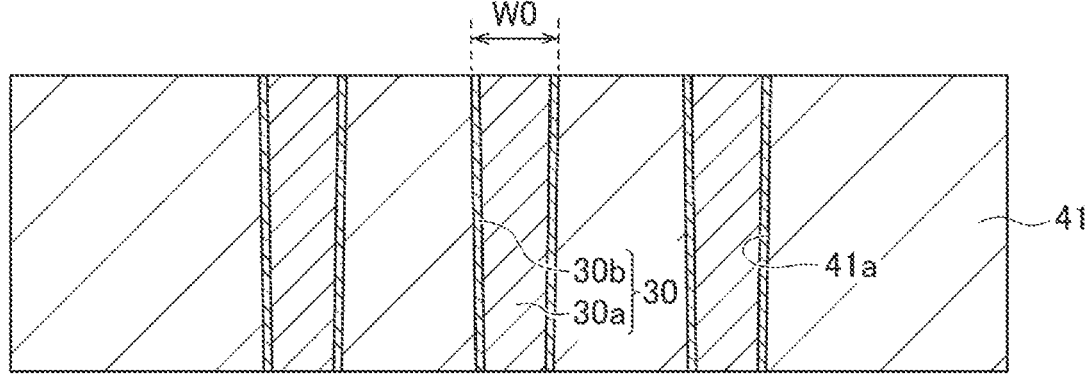
FIGS. 3A to 3F are process diagrams for explaining another manufacturing method of the semiconductor device according to the embodiment of the present disclosure.
Figure 3B:
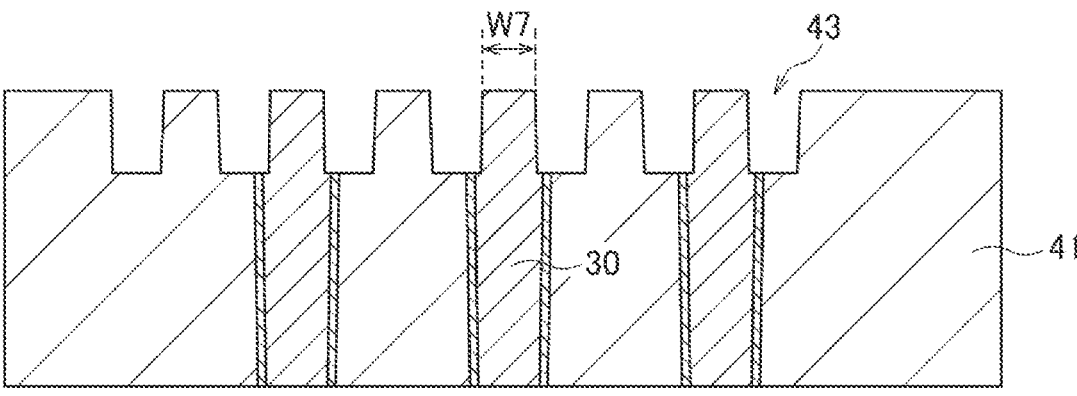

Next, another manufacturing method of the semiconductor device according to the present embodiment is described. First, as shown in FIG. 3A, the via hole 41a is formed in the interlayer insulating film 41, and thereafter the contact plug 30 including the bather metal portion 30b and the main body 30a is formed in the via hole 41a. The contact plug 30 penetrates through the interlayer insulating film 41 and is in contact with the wiring pattern 11. A portion of conductive materials forming the contact plug 30, which is formed on the top surface of the interlayer insulating film 41, is removed by CMP or the like. With this process, the top surface of the interlayer insulating film 41 is exposed without being covered with the conductive material. Next, as shown in FIG. 3B, the contact plug 30 and the interlayer insulating film 41 are patterned in stripes, whereby the grooves 43 extending in the Y direction are formed. The space W7 between two of the grooves 43 adjacent to each other in the X direction is smaller than the size W0 in the X direction of the top surface of the contact plug 30. Accordingly, a part of the side wall of the contact plug 30 is removed by the grooves 43, a region sandwiched between the grooves 43 forms the upper conductive section 32, and a region located at a deeper position than the grooves 43 forms the lower conductive section 31.

Figure 3C:
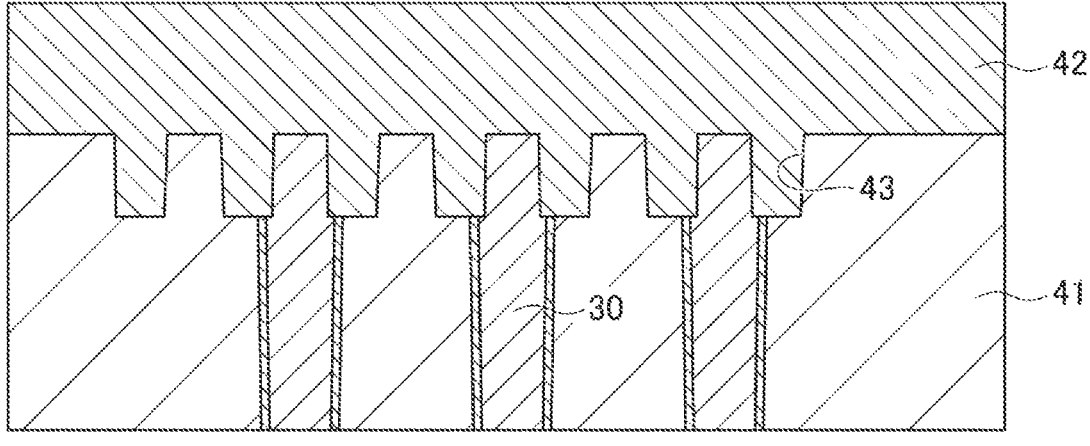

Next, as shown in FIG. 3C, the spacer insulating film 42 made of, for example, a Low-k material is deposited by CVD on the entire surface to be embedded in the grooves 43

Figure 3D:
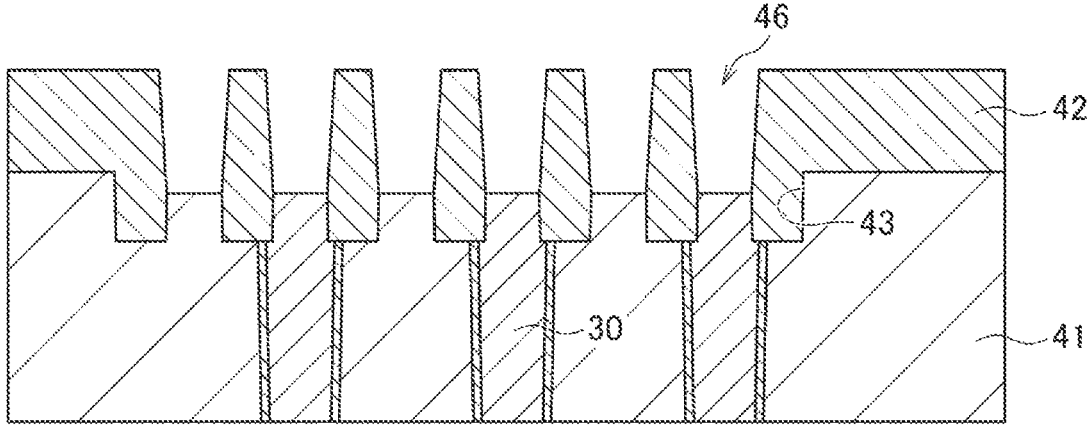
Figure 3E:
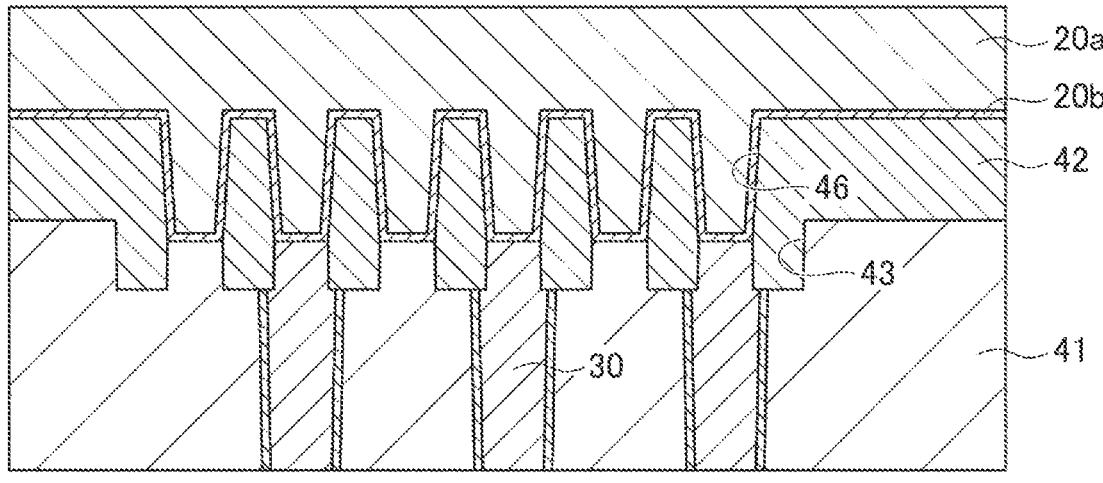
Figure 3F:
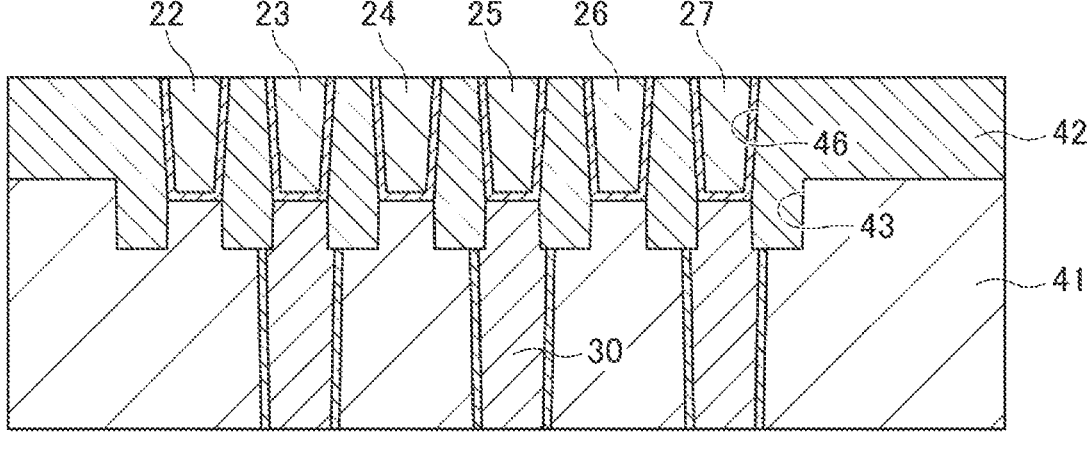

5 and is then patterned in stripes. Accordingly, as shown in FIG. 3D, a plurality of grooves 46 extending in the Y direction are formed. The upper conductive section 32 of the contact plug 30 is exposed at the bottom surface of each groove 46. Next, as shown in FIG. 3E, the conductive material 20*a* made of, for example, Cu is formed on the entire surface via the barrier metal 20*b* to be embedded in the grooves 46, and thereafter CMP is performed until the spacer insulating film 42 is exposed, thereby obtaining the configuration shown in FIG. 3F.

With the processes shown in FIGS. 3A to 3F, the depth of the grooves 43 can be made shallow. Therefore, a low-coverage material can be used as the material for the spacer insulating film 42.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
a first conductive pattern positioned at a first wiring layer and extending in a first direction;
a second conductive pattern positioned at a second wiring layer located above the first wiring layer and extending in a second direction crossing the first direction; and
a contact plug connecting the first conductive pattern with the second conductive pattern,
wherein the contact plug includes a lower conductive section contacting the first conductive pattern and an upper conductive section contacting the second conductive pattern, and
wherein a width of the lower conductive section on a first boundary between the lower conductive section and the upper conductive section in the first direction is greater than a width of the upper conductive section on the first boundary in the first direction and a width of the second conductive pattern on a second boundary between the contact plug and the second conductive pattern in the first direction.

2. The apparatus of claim 1, wherein a width of the contact plug on the second boundary in the first direction is substantially the same as the width of the second conductive pattern on the second boundary in the first direction.

3. The apparatus of claim 1, wherein a width of the lower conductive section on the first boundary in the second direction is substantially the same as a width of the upper conductive section on the first boundary in the second direction.

4. The apparatus of claim 1, further comprising:
an interlayer insulating film located between the first and second wiring layers, wherein the contact plug penetrates the first interlayer insulating film; and

a spacer insulating film embedded in the interlayer insulating film,
wherein the lower conductive section is surrounded by the interlayer insulating film, and
wherein the upper conductive section is surrounded by the interlayer insulating film and the spacer insulating film.

5. The apparatus of claim 4, wherein the upper conductive section has first and second side surfaces located opposite to each other and each contacting the interlayer insulating film and third and fourth side surfaces located opposite to each other and each contacting the spacer insulating film.

6. The apparatus of claim 5,
wherein the contact plug includes a main metal part and a barrier metal part located between the main metal part and the interlayer insulating film,
wherein the first and second side surfaces comprise the barrier metal part, and
wherein the third and fourth side surfaces comprise the main metal part.

7. The apparatus of claim 6, wherein the spacer insulating film extends in the second direction along the second conductive pattern.

8. The apparatus of claim 7, wherein the second conductive pattern has side surfaces contacting the spacer insulating film and a lower surface contacting the contact plug and the interlayer insulating film.

9. The apparatus of claim 4, wherein the spacer insulating film is lower in dielectric constant than the interlayer insulting film.

10. An apparatus comprising:
a contact plug having a lower conductive section and an upper conductive section;
an interlayer insulating film surrounding the lower conductive section of the contact plug; and
a first spacer insulating film partially on the lower conductive section of the contact plug with partially overlapping the lower conductive section of the contact plug;
a second spacer insulating film partially on the lower conductive section of the contact plug with partially overlapping the lower conductive section of the contact plug; and
a first conductive pattern formed on the upper conductive section of the contact plug,
wherein the upper conductive section of the contact plug is sandwiched between the first spacer insulating film and the second spacer insulating film, and
wherein the first conductive pattern extends in a first direction and the first conductive pattern is sandwiched between the first and second spacer insulating films arranged in parallel in a second direction crossing the first direction.

11. The apparatus of claim 10, wherein a maximum width of the upper conductive section in the second direction is smaller than a maximum width of the lower conductive section in the second direction.

12. The apparatus of claim 11,
wherein a first step is provided as a part of a top surface of the lower conductive section uncovered with a bottom surface of the upper conductive section, and
wherein a bottom surface of the first spacer insulating film partially contacts the first step.

13. The apparatus of claim 12,
wherein a second step is further provided as another part of the top surface of the lower conductive section uncovered with the bottom surface of the upper conductive section, wherein a bottom surface of the second spacer insulating film partially contacts the second step, wherein the lower conductive section further has a second top surface free from the upper conductive section, wherein the second top surface of the lower conductive section contacts a bottom surface of the lower insulating section of the second spacer insulating film.

14. The apparatus of claim 10, further comprising:

a third spacer insulating film extending in the first direction along the first spacer insulating film, the third spacer insulating film having a lower insulating section embedded in the interlayer insulating film and an upper insulating section protruding from the interlayer insulating film;

a fourth spacer insulating film extending in the first direction along the second spacer insulating film, the fourth spacer insulating film having a lower insulating section embedded in the interlayer insulating film and an upper insulating section protruding from the interlayer insulating film;

a second conductive pattern formed on the interlayer insulating film, the second conductive pattern being sandwiched between the upper insulating sections of the first and third spacer insulating films in the second direction; and a third conductive pattern formed on the interlayer insulating film, the third conductive pattern being sandwiched between the upper insulating sections of the second and fourth spacer insulating films in the second direction.

15. The apparatus of claim 14, wherein each of the first, second, third, and fourth spacer insulating films is lower in dielectric constant than the interlayer insulting film.

* * * * *